United States Patent [19]

Koizumi et al.

[11] Patent Number: 5,207,222

[45] Date of Patent: May 4, 1993

[54] METHOD AND APPARATUS FOR MEASURING TEMPERATURE OF SUBJECT

[75] Inventors: Hideaki Koizumi, Katsuta; Ryuzaburo Takeda, Mito; Koichi Sano, Yokohama; Tetsuo Yokoyama, Tokyo, all of Japan

[73] Assignee: Hitachi, Ltd., Chiyoda, Japan

[21] Appl. No.: 713,316

[22] Filed: Jun. 11, 1991

[30] Foreign Application Priority Data

Jun. 15, 1990 [JP] Japan .................. 2-157262

[51] Int. Cl.$^5$ .................................. A61B 5/055
[52] U.S. Cl. .................. 128/653.2; 128/736; 324/315
[58] Field of Search ............ 128/653.2, 736; 324/315

[56] References Cited

U.S. PATENT DOCUMENTS 4,914,608 4/1990 LeBihan et al. .......... 324/315

OTHER PUBLICATIONS

Magnetic Resonance Imaging, Stark & Bradley, The C.V. Mosby Company, 1988, pp. 15-23.

*Primary Examiner*—Ruth S. Smith
*Attorney, Agent, or Firm*—Antonelli, Terry, Stout & Kraus

[57] ABSTRACT

Based on the relation that the higher the temperature of a portion to be measured, the lower becomes coherence of a nuclear spin at that portion, the present invention measures indirectly the temperature state of the portion to be measured from the change of intensity of NMR signals by utilizing this relationship. A transverse relaxation time is contained as one of the parameters in the relation between the signal intensity and the temperature; hence this transverse relaxation time is determined in advance for the portion to be measured and utilized in for the equation representing their relationship. This application discloses also an invention for determining a blood perfusion rate of the portion to be measured from the temperature data obtained in the manner described above.

20 Claims, 4 Drawing Sheets

METHOD AND APPARATUS FOR MEASURING TEMPERATURE OF SUBJECT

BACKGROUND OF THE INVENTION

This invention relates to a method and apparatus for measuring a temperature of a subject. More specifically, the present invention relates to a technology for measuring non-invasively the distribution of internal temperatures of a human body, or the like, by utilizing tomographic technique of a magnetic resonance imaging apparatus and displaying the distribution, and can be utilized for medical diagnosis.

A clinical thermometer is a typical known means for measuring the temperature of part of a human body but is not the means for measuring the temperature distribution of the human body. An apparatus which can measure the temperature distribution of a body surface by measuring the distribution density of infrared rays emitted from the body surface is known as means for measuring the temperature distribution of the human body.

Information on the body temperature of the human body has been very useful for medical diagnosis even if such information is information of part of the human body or the temperature distribution information on the body surface. Therefore, it would be revolutionary for medical treatment if means capable of measuring the temperature distribution inside the human body non-invasively and accurately were available.

Technology disclosed in JP-A-61-8040 and JP-A-62-81538 is known as a prior art technology for measuring the temperature distribution inside the human body. However, these technologies have not yet been put sufficiently into practical use.

SUMMARY OF THE INVENTION

It is a first object of the present invention to measure non-invasively and continuously the temperature condition of a subject inclusive of the internal temperature condition.

It is a second object of the present invention to measure two- or three-dimensionally, non-invasively and continuously the internal temperature distribution of a subject such as a human body.

It is a third object of the present invention to measure non-invasively and continuously the temperature of the inside of a subject and express in an absolute unit.

It is a fourth object of the present invention to measure non-invasively and continuously the flow rate of blood perfusion inside a subject.

In order to accomplish the objects described above, the present invention pays specific attention to the fact that coherence of a nuclear spin depends on the temperature of a give portion of a subject. In other words, the higher the temperature, the lower becomes coherence; hence, the intensity of its magnetic resonance drops. Accordingly, the temperature of that portion is measured indirectly from the change of the intensity of the magnetic resonance signal by utilizing the relation described above.

A technology of obtaining a two- or three-dimensional tomogram of a subject by irradiation a magnetic field to a portion of the subject to be measured by a specific method, subjecting the frequency of the nuclear magnetic resonance signal emitted from this portion to Fourier transform and expressing the signal intensity by contrast is know generally. The present invention detects the change of coherence of the nuclear spin or in other words, the change of the temperature, as the change of the signal intensity, associates multi-dimensionally the changes of the signal intensity by utilizing the frequency of signals and expresses them as a temperature distribution as described above.

If the relation between the change of intensity of the nuclear magnetic resonance signal and the temperature is determined for the portion whose temperature is known, the temperature of a portion to be measured can be expressed in an absolute unit such as a centigrade from the change of the signal intensity by referring to the relation.

If any tumor exists in the tissue of a human body or the like or if any damage exists in the tissue or in the blood vessel, a change occurs in the flow of a body fluid. If any change occurs in the flow of the blood, for example, respiration capacity inside the body changes. If the respiration capacity changes, consumed energy as that portion changes, as well, providing thereby the change to the body temperature. The change of the flow of the blood can be grasped by measuring this temperature change. In this specification, the flow rate of the blood is defined as "perfusion" (the quantity of the blood flowing into a unit volume of tissue). Accordingly, inflammation of muscle, tumor, closure of blood vessels in the brain, etc., can be diagnosed.

Needless to say, such inflammation and the like can be diagnosed directly by utilizing the temperature difference of the tissue.

DESCRIPTION OF THE PREFERRED EMBODIMENTS

Hereinafter, a preferred embodiment of the invention will be explained with reference to the accompanying drawings.

Figure 1:
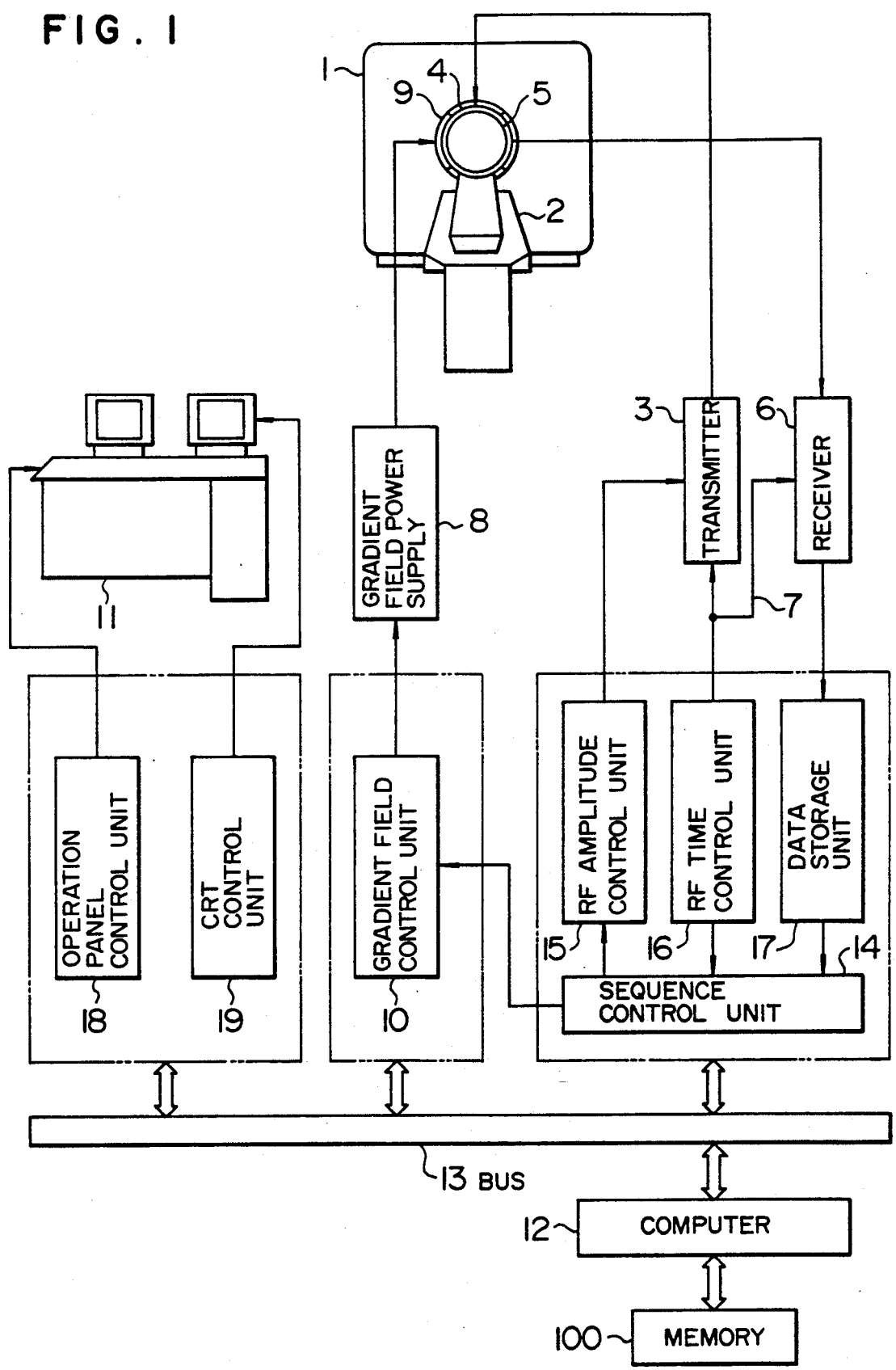
FIG. 1 is a block diagram showing the structure of an apparatus for executing a temperature measuring method in accordance with the present invention.

FIG. 1 shows a schematic system configuration of an apparatus for practicing the temperature measuring method in accordance with the present invention. The structure of this apparatus is fundamentally the same as that of a magnetic resonance imaging apparatus (MRI) and can be therefore accomplished by the application of the magnetic resonance imaging apparatus.

In FIG. 1, reference numeral 1 denotes a magnet, which constitutes the principal portion of the apparatus of this invention. The magnets 1 that have been used conventionally include a superconductivity type, a normal conductivity type and a permanent magnet type, and this embodiment uses the superconductivity type. The magnet 1 has a magnet intensity of 0.5 T, a bore diameter of 1 m and a field uniformity of 5 ppm/30 cmdsv (sphere), for example.

A subject lies down on a patient table 2 and is then sent to the center portion of the magnet 1. A static field is generated in the internal space of the magnet 1 and gradient fields in 3-axis directions are superposed with this static field in order to obtain spatial position data. An electromagnetic wave of a radio frequency (RF) for generating a magnetic resonance phenomenon (hereinafter referred to as "MR") is sent from a transmitter 3 to an irradiation coil 4. The MR signal generated from the subject is detected by a reception coil 5 and is sent to a receiver 6. Since the phase data of the MR signal is important in MR, the phase relation between the transmitter 3 and the reception coil 5 is synchronized correctly through a receiver gate signal 7.

A gradient field Power source 8 is constituted in such a manner as to generate independently gradient fields in X, Y and Z 3-axis direction by a gradient field coil 9 including each gradient field coil for each of the X, Y and Z directions, and is equipped with three-channel power sources for this purpose. The portion from which the MR signal is to be taken out can be stipulated in the body of the subject by the combination of the gradient fields in the X, Y and Z directions. Since the gradient field in each of the X, Y and Z direction is applied in the form of pulse, high response is required for the apparatus as a whole. Generation of the pulse by the gradient field power source 8 is controlled by a gradient field control unit 10.

The operation of the temperature measuring apparatus in this embodiment is controlled by use of an operation panel 11. Various operation keys and two CRTs are provided to the operation panel 11. One of the CRTs is used for setting various parameters in an interactive system and for operating the system as a whole and the other is used for displaying the resulting image.

A computer 12 controls the entire system and executes high speed operations for image construction. Data exchange between the computer 12 and each control system is made through a bus 13. A sequence control unit 14 controls various pulse sequences. In this case, the central sequence is constituted by the combination of an RF pulse and a gradient field pulse.

An RF amplitude control unit 15, an RF time control unit 16 and a data storage unit 17 are disposed as other constituent elements in FIG. 1 in association with the sequence control unit 14. The RF amplitude control unit 15 gives amplitude data to the transmitter 3. The RF time control unit 16 provides the receiver gate signal 7 to the transmitter 3 and to the receiver 6 as described already. The data storage unit 17 stores the MR signal received by the receiver 6 and sends it to the sequence control unit 14. The sequence control unit 14 provides predetermined control signals to the RF amplitude control unit 15, to the RF time control unit 16 and further to the gradient field control unit 10, respectively. Reference numeral 18 denotes an operation panel control unit and reference numeral 19 does a CRT control unit.

Figure 2:
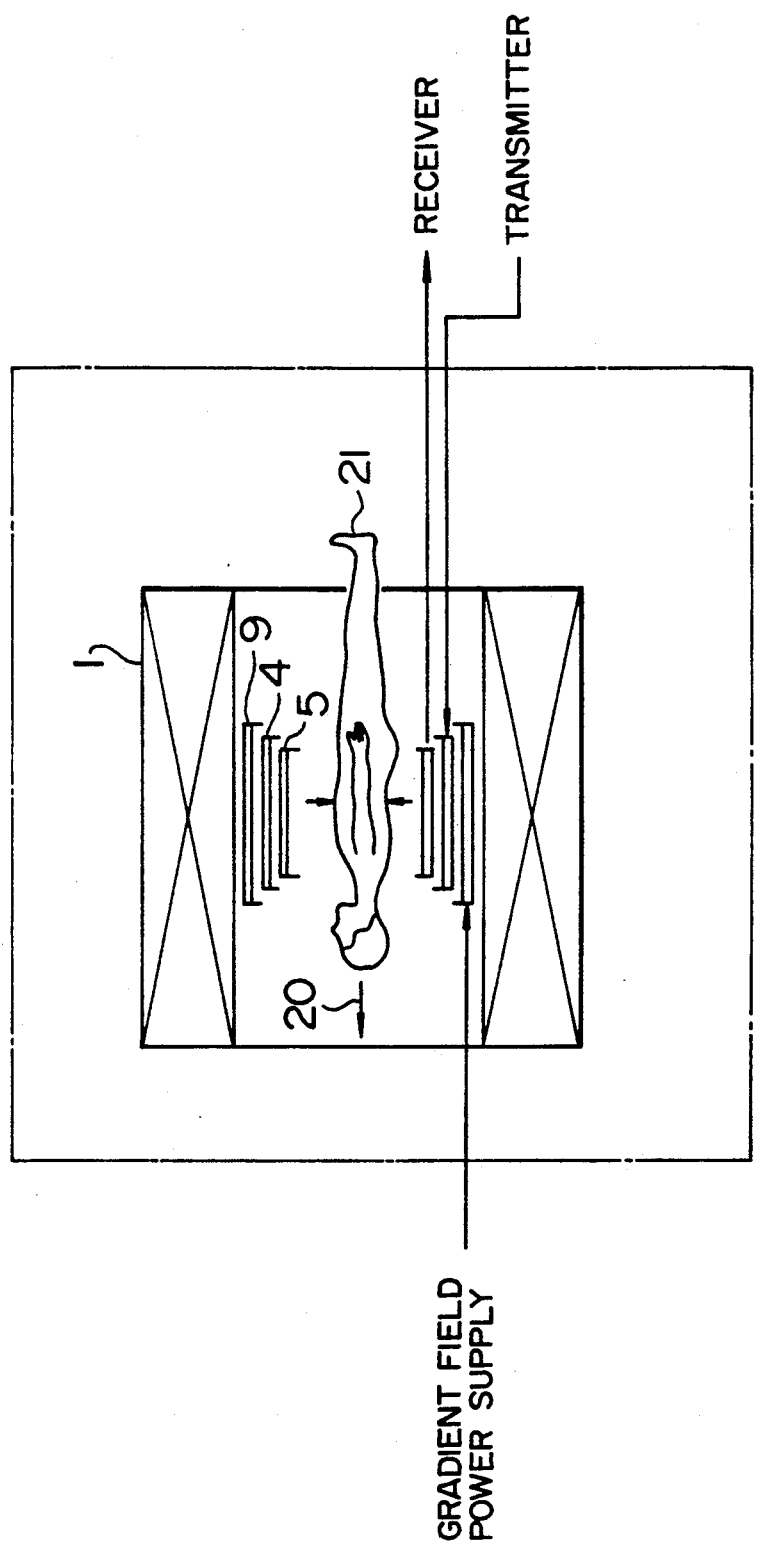
FIG. 2 is a schematic enlarged view of a portion to be measured.

FIG. 2 depicts schematically the structure of the measuring portion of a magnetic resonance imaging apparatus. The superconductivity type magnet 1 comprises an ultra-low temperature static field coil utilizing liquid helium and includes thereinside a gradient field coil 9, an irradiation coil 4 and a reception coil 5 that are disposed coaxially. Reference numeral 20 denotes the direction of the static field, which is generally in conformity with the Z-axis direction. The gradient fields which are completely independent in the 3-axis directions of X, Y and Z from one another must be provided and three kinds of coils are therefore disposed for the X, Y and Z axes, respectively.

Figure 3:
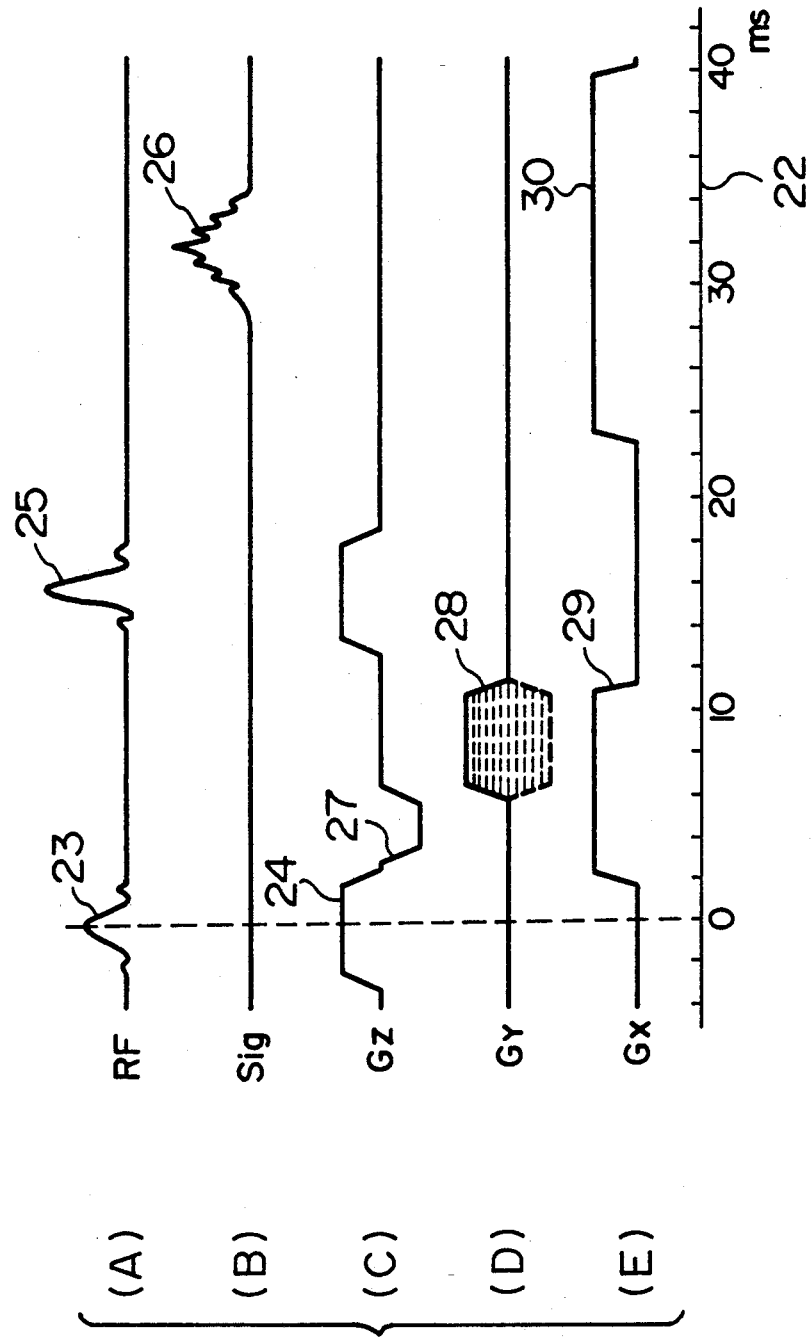
FIG. 3 is an explanatory waveform diagram useful for explaining an ordinary image forming method.

FIG. 3 shows an example of a pulse sequence. FIG. 3(A) shows the pulse waveform of the radio frequency RF, that is, the RF power irradiated from the irradiation coil 4 to the subject 21. Accordingly, the MR phenomenon is induced inside the body of the subject 21. The signal Sig. in FIG. 3(B) represents in amplification the electromagnetic force in the reception coil 5, and reference numeral 26 denotes a later-appearing MR signal (spin echo signal). The gradient field Gz in FIG. 3(C) represents the gradient field that is applied in the direction of the static field 20 or in other words, in the Z-axis direction. This gradient field selects a tomographic position. The gradient field Gy in FIG. 3(D) encodes the phase in the Y-axis direction. The gradient field Gx in FIG. 3(E) lets the coordinates in the X-axis direction correspond on the 1:1 basis to the same wave number. It is generally used for the generation of the MR signal and is interpreted as a gradient field for reading. A time axis 22 clarifies the time relation for all the pulses on the time axis.

Next, the roles of these various pulses and the principle of an image construction method which is referred to as a "two-dimensional Fourier method" will be described.

In the example shown in FIG. 3, a sinc function is used for the waveform of the RF pulse. When the sinc function is subjected to Fourier transform, it is turned to a rectangular wave. In other words, the sinc function in the time space becomes a rectangular wave in the frequency space. Therefore, it has only the frequency of a certain limited zone as its frequency components. In FIG. 3, a gradient field pulse 24 is applied to the gradient field Gz simultaneously with a 90° pulse 23 (the pulse for inverting by 90° the nuclear spin). Since the condition for magnetic resonance in the MR phenomenon is expressed by the formula below, only the specific tomographic plane in the Z-axis direction is excited selectively.

$$W_o = \gamma[H_o + H_G(Z)] \tag{1}$$

where
$W_o$ is an angular velocity at a magnetic resonance point,
$\gamma$ is a gyromagnetic ratio,
$H_o$ is a flux density of a static field and
$H_G(Z)$ is a flux density of the gradient field at a position Z.

In an ordinary magnetic resonance imaging apparatus, a selected irradiation frequency is set within the range of the thickness of a tomographic plane of from 1 to 20 mm. In this embodiment, a 180° pulse 25 is applied after the 90° pulse 23 and the MR signal 26 is obtained. Incidentally, in an original two-dimensional Fourier transform method, the MR signal is generated by the gradient field and the 180° pulse is not used. The technology of generating the MR signal is the one that rearranges again after the passage of a predetermined time those phases which disperse rapidly with an apparent spin-spin relaxation time $T_2$ by a non-uniform magnetic field. The gradient field, too, is a kind of non-uniform field and in order to obtain signals having uniform phases, it is necessary either to inverse the gradient field or to apply the 180° pulses simultaneously with the gradient field. When the gradient field is raised practically, the rise time and the fall time are definite and a period of about 1 ms, for example, is necessary. Therefore, the phases get disturbed during this transient period. When a compensation pulse 27 is applied immediately after the gradient pulse 24 so as to compensate for this disturbance, the rise and the fall are offset with each other and the state at this time is the same as when an apparently complete rectangular wave is applied.

Next, phase encoding will be described. The fundamental properties of the behaviours of the nuclear spin in the MR phenomenon are as follows:
(1) direction of magnetic moment;
(2) magnitude of magnetic moment;
(3) number of magnetic moments;
(4) pertubation frequency of magnetic moment;
(5) phase of pertubation of magnetic moment.

The macroscopic behaviour of magnetization can be described as a statical result of these individual parameters. In particular, the frequency and the phase are independent parameters and the MR signal can be made to correspond to the spatial coordinates by encoding the phase.

The gradient field that encodes the phase is the gradient field Gy shown in FIG. 3. Since the phase encoding quantity is determined by the integration value of the gradient field for encoding, either the amplitude of the pulse or the pulse width may be changed. In FIG. 3, the amplitude is changed as represented by the pulse 28.

The gradient field Gx is the one that is applied in the X-axis direction. When the gradient field pulse 29 in the X-axis direction is applied to the nuclear spin which is excited by the 90° pulse and exhibits coherent precession, the frequency of this precession changes linearly with respect to the X-axis direction. The MR signal 26 can be generated by applying likewise the gradient field pulse 30 after the 180° pulse 25. Since the X-axis coordinates and the resonance frequency have a linear relation, the relation of the signal intensity with respect to the X-axis coordinates can be obtained by subjecting the MR signal 26 to Fourier transform. When the resulting signal is again subjected to Fourier transform in the phase encoding direction (in the Y-axis direction), the relation of the signal intensity with respect to the Y-axis coordinates can then be obtained. Since the signal distribution can thus be obtained for the X-Y plane, a tomogram can be obtained by displaying the signal intensity on a CRT. 3D Fourier transform image is executed in a similar way (refer to Advanced Imaging Techniques edited by Newton and Potts, Clavadel Press, 1983, pp 87-89).

The tomographic time necessary for visualizing an internal tissue or a focus, for example, by the means described above is generally from several minutes to about 20 minutes.

Next, a modified pulse sequence for accomplishing the temperature measuring method of the present invention by the application of the principle of magnetic resonance imaging described above will be explained with reference to FIG. 4.

Figure 4:
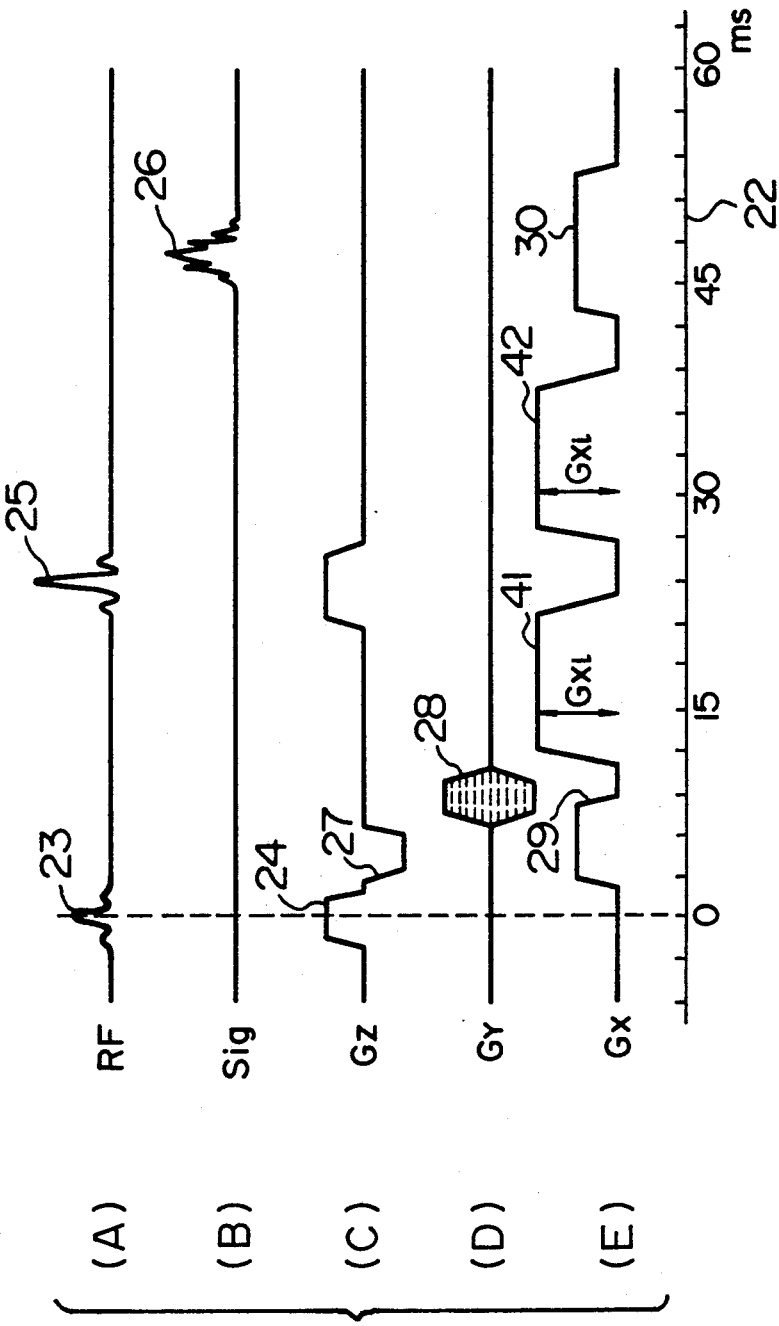
FIG. 4 is a waveform diagram useful for explaining the temperature measuring method in accordance with the present invention.

In the modified pulse sequence shown in FIG. 4, the same reference numeral is put to the same portion as the pulse sequence shown in FIG. 3. The difference from the pulse sequence shown in FIG. 3 is that a dephase pulse 41 and a rephase pulse 42 are additionally put to the gradient field Gx for reading. When the nuclear spin is once dephased and is thereafter rephased, the nuclear spin having large thermal motion receives thermal turbulence in the interim and does not rephase to the original state. In other words, coherence of the signal intensity of the detected MR signal is reduced in accordance with the thermal motion quantity of the nuclear spin by use of the dephase pulse 41 and the rephase pulse 42 and becomes a quantity dependent on the thermal motion of the nuclear spin. It is expressed quantitatively by the following formula:

$$S = S_o \exp(-TE/T_2) \cdot \exp(-\gamma^2 Gxi^2 D\delta^2 (\Delta - \delta/3)) \quad (1)$$

The parameters in the formula above are as follows:
S: signal intensity
$S_o$: reference signal intensity
TE: echo time
$T_2$: transverse relaxation time
$\gamma$: gyromagnetic ratio
Gxi: magnitude of dephase/rephase pulse
D: diffusion coefficient
$\delta$: dephase/rephase pulse width
$\Delta$: time interval of dephase pulse and rephase pulse The dephase pulse and the rephase pulse are utilized in conjunction with RF pulses, respectively (refer to Journal of Magnetic Resonance 81, 1-12 (1989)).

As is obvious from the formula given above, the diffusion coefficient D can be determined by obtaining the signal intensity S for each pixel by changing only the magnitude of Gxi. In other words, the diffusion coeffficient D can be obtained by plotting the resulting signal intensity to the graph using $Gxi^2$ for the abscissa and lnS for the ordinate. For example, Gxi is changed over the three stages of 0 G, 0.2 G and 0.3 G and the value of the diffusion coefficient calculated from the formula given above is alloted to each pixel so as to display the image. If any portion having a different temperature exists inside the same tissue, the value of the diffusion coefficient of the portion becomes different, so that the portion having the different temperature can be observed as the difference of brightness on the image. If any inflammatory portion exists in a muscle tissue, for example, in such an observation method, the portion causes exothermy and the inflammatory portion can be displayed with higher brightness.

In the formula expressing the signal intensity S that is given above, an error will occur depending on the portion inside the body when an absolute temperature is measured because the formula includes the transverse relaxation time $T_2$ as one of the parameters. Accordingly, the temperature difference between the tissues can be displayed with a higher level of accuracy by acquiring in advance the image of the $T_2$ value by a spin echo method or a balanced conditions method in MRI and then effecting correction inclusive of this $T_2$ value. Incidentally, this $T_2$ value is preserved in the memory 100 shown in FIG. 1 and is read out and used when the diffusion coefficient D is calculated from the formula (1) given already.

The $T_2$ is obtained by solving the following equations (2) and (3)

$$I_{SE} = k\rho \{1 - \exp(-t_I/T_1)\} \exp(-t_E/T_2) \quad (2)$$

$$I_{IR} = k\rho \{1 - 2\exp(-t_R/T_1)\} \exp(-t_E/T_2) \quad (3)$$

where k is proportional constant, $\rho$ is density of Proton, $T_1$ is spin-lattice relaxation time, $T_2$ is spin-spin relaxation time, $t_I$ is waiting time of inversion, $t_R$ is repetition time and $t_E$ is echo time. The signal $I_{SE}$ of the spin-echo method is obtained in accordance with the equation (2) and the signal $I_{IR}$ of Inversion-Recovery method is obtained in accordance with the equation (3). Further, approximate magnitudes of the $T_1$ and $T_2$ are also obtainable from the Steady State Free Precession Method.

Preferably, the portion to be measured of the subject is in advance heated in order to display the temperature distribution with a higher contrast.

The temperature distribution obtained by the embodiment described above represents only a relative temperature difference of the portion to be measured. Therefore, this embodiment determines the relation between the temperature and the diffusion coefficient D, which is equal to the relation between the temperature and the signal intensity (the first relation) from the formula (1), for the portion whose temperature is known already (the second portion) in the same way as described above. This relation is tabulated or stored in a memory by approximation by functional formulas. Thereafter, the measurement described above is effected for the portion to be measured (the first portion) and the result obtained thereby is compared with the first relation stored in the memory 100. In this manner the temperature of the portion to be measured can be expressed in an absolute unit such as a centigrade.

If any tumor exists in the tissue of a human body or if any damage exists in the tissue or the blood vessel, a change occurs in the flow of the body fluid. If any change occurs in the flow of the blood, for example, the respiration capacity changes inside the body. If the respiration capacity changes, consumed energy of that portion changes, as well, providing thereby a change to the body temperature. Accordingly, the change of the flow of the blood can be grasped by measuring this temperature change. In this embodiment, the relation between the temperature of the portion to be measured and the blood perfusion rate (the second relation) is determined beforehand and is stored in the memory 100. Then, the blood perfusion rate of the portion to be measured can be stipulated by comparing the temperature obtained by the method described already with the second relation. Closure of the blood vessel can be diagnosed from this rate because the perfusion rate downstream of the closed portion drops. It is also possible to observe the active portions of the brain proper because the perfusion rate is believed to be greater at the portions which are more active.

As is obvious from the explanation given above, this embodiment permits the gradient field for reading to contain the predetermined dephase pulse and rephase pulse and can detect the reduction state of coherence in the MR signal. Accordingly, this embodiment can measure non-invasively the thermal motion of the nuclear spin associated with the reduction state of coherence or in other words, the internal temperature of the portion of the subject, and if image reconstruction is made by use of these measurement data, the temperature distribution of the arbitrary portion inside the human body can be displayed as a two- or three-dimensional image. Accordingly, this embodiment can display the temperature change of the internal tissue on the screen and can diagnose non-invasively various inflammatory portions. If this technique is further expanded in the field of medical diagnosis, it will be able to detect the temperature change due to the closure of the blood vessels, to diagnose the closed portion of the blood vessels, to detect the temperature change of the portion inside the brain proper and to measure the active portions inside the brain proper.

We claim:

1. A method of measuring a temperature of a subject comprising:
   a step of applying a static field to said subject;
   a step of applying a first field to said subject so as to excite a nuclear spin of a portion of said subject to be measured;
   a step of applying a second field to said subject so as to generate NMR signals from said portion to be measured;
   a step of applying a third field to said subject so as to change coherence of said nuclear spin in accordance with a temperature distribution of said portion to be measured; and
   a step of reading said NMR signals and obtaining the temperature state of said portion to be measured from the change of intensity of said NMR signals corresponding to the change of coherence of said nuclear spin.

2. A method of measuring a temperature of a subject according to claim 1, further comprising a step of associating multi-dimensionally the changes of intensity of said NMR signals by utilizing the frequency of said NMR signals and obtaining the temperature distribution of said portion to be measured.

3. A method of measuring a temperature of a subject according to claim 1, wherein said step of obtaining the temperature distribution includes utilizing a functional relation between said coherence and the intensity of said NMR signals containing a transverse relaxation time of said nuclear spin as a parameter.

4. A method of measuring a temperature of a subject according to claim 3, which further includes a step of obtaining a transverse relaxation time of said spin of said portion to be measured, and utilizing the obtained transverse relaxation time in the relation between said coherence and the intensity of said NMR signals.

5. A method of measuring a temperature of a subject according to claim 1, further comprising the step of heating said portion to be measured so that the temperature of said portion to be measured is higher than that of other portions of said subject.

6. A method according to claim 1, wherein said second field is a radio frequency field.

7. A method of measuring a temperature distribution of a subject comprising:
   (a) a step of applying a static field to said subject;
   (b) a step of applying a radio frequency field for inducing magnetic resonance to said subject;
   (c) a step of applying a gradient field in a Z-axis direction of said subject in order to select a portion to be measured;
   (d) a step of applying a gradient field for phase encoding in a Y-axis direction of said subject;
   (e) a step of applying a gradient field for reading in an X-axis direction of said subject;
   (f) a step of applying a field for temperature measurement to said subject so as to change coherence o said nuclear spin in accordance with the temperature distribution of said portion of said subject to be measured;
   (g) a step of executing said steps (b) through (f) while changing at least said gradient field for phase encoding, and emitting a large number of NMR signals from said portion to be measured; and
   (h) a step of reading said NMR signals and obtaining the temperature distribution of said portion to be measured from the intensity of said NMR signals corresponding to the change of coherence of said nuclear spin and the frequency corresponding to the position of said nuclear spin.

8. A method of measuring a temperature distribution of a subject according to claim 7, wherein said field for temperature measurement in said step (f) comprises a dephase pulse and a rephase pulse that are applied in the X-direction of said subject and the change of coherence of said nuclear spin is expressed as the change of amplitude of said NMR signals after the application of said pair of pulses.

9. A method of measuring a temperature distribution of a subject according to claim 8, wherein said dephase pulse and said rephase pulse are generated by means for generating said gradient field for reading.

10. A method of measuring a temperature distribution of a subject according to claim 9, wherein said step (f) includes utilizing the following relation between said coherence of said nuclear spin and the intensity of said NMR signals:

$$S = S_o \exp(-TE/T_2) \cdot \exp\{-\gamma^2 G x i^2 D \delta 2 (\Delta - \delta/3)\}$$

where
S: signal intensity
$S_o$: reference signal intensity
TE: echo time
$T_2$: transverse relaxation time
$\gamma$: gyromagnetic ratio
Gxi: magnitude of dephase/rephase pulse
D: diffusion coefficient, i.e. coefficient expression of coherence
$\delta$: dephase/rephase pulse width
$\Delta$: time interval of dephase/rephase pulse.

11. A method according to claim 7, wherein said radio frequency field is generated by a RF pulse generator.

12. A method of measuring a temperature of a subject comprising:
(a) a step of applying a static field to said subject;
(b) a step of applying a first field to said subject so as to excite a nuclear spin at a portion of said subject to be measured;
(c) a step of applying a second field to said subject so as to generate NMR signals from said portion to be measured;
(d) a step of applying a third field to said subject so as to change coherence of said nuclear spin in accordance with a temperature distribution of said portion to be measured;
(e) a step of reading said NMR signals and obtaining the temperature state of said portion to be measured from the change of intensity of said NMR signals corresponding to the change of coherence of said nuclear spin;
(f) a step of executing said steps (b) through (e) for a second portion of said subject whose temperature is known and serves as a reference portion, and obtaining a relation between the change of intensity of said NMR signals and the temperature; and
(g) a step of comparing the change of intensity of said NMR signals obtained from said portion to be measured with said relation, and expressing the temperature of said portion to be measured in an absolute unit.

13. A method of measuring a perfusion rate of a body fluid of a subject, comprising:
a step of obtaining in advance a relation between a temperature state of a portion of said subject to be measured, for which measurement of the perfusion rate of the body liquid is required, and the perfusion rate of the body fluid;
a step of applying a static field to said subject;
a step of applying a first field to said subject so as to excite a nuclear spin at the portion of said subject to be measured;
a step of applying a second field to said subject so as to generate NMR signals from said portion to be measured;
a step of applying a third field to said subject so as to change coherence of said nuclear spin in accordance with a temperature distribution of said portion to be measured;
a step of reading said NMR signals and obtaining the temperature state of said portion to be measured from the change of intensity of said NMR signals corresponding to the change of coherence of said nuclear spin; and
a step of comparing said temperature state with said relation and obtaining the perfusion rate of the body fluid of said portion to be measured.

14. A method according to claim 13, wherein the body fluid is blood.

15. An apparatus for measuring a subject, comprising:
means for applying a static field to said subject;
means for applying a first field to said subject so as to excite a nuclear spin at a portion of said subject to be measured;
means for applying a second field to said subject so as to generate NMR signals from said portion to be measured;
means for applying a third field to said subject so as to change coherence of said nuclear spin in accordance with a temperature distribution of said portion to be measured; and
means for obtaining the temperature state of said portion to be measured from the change of intensity of said NMR signals in accordance with the change of coherence of said nuclear spin.

16. An apparatus for measuring a temperature distribution of a subject, comprising:
(a) means for applying a static field to said subject;
(b) means for applying a radio frequency field for inducing magnetic resonance to said subject;
(c) means for applying a gradient field for selecting a portion to be measured in a Z-axis direction of said subject;
(d) means for applying a gradient field for phase encoding to a Y-axis of said subject;
(e) means for applying a gradient field for reading in an X-axis direction of said subject;
(f) means for applying a field for temperature measurement to said subject so as to change coherence of a nuclear spin in accordance with a temperature distribution of said portion to be measured;
(g) means for executing the operations of said means (b) through (f) while changing at least said gradient field for phase encoding, and emitting a large number of NMR signals from said portion to be measured; and
(h) means for reading said NMR signals and obtaining the temperature distribution of said portion to be measured from the intensity of said NMR signals corresponding to the change of coherence of said nuclear spin and from its frequency corresponding to the position of said nuclear spin.

17. An apparatus for measuring a temperature of a subject, comprising, (a) means for applying a static field to said subject;

(b) means for applying a first field to said subject so as to excite a nuclear spin at a portion of said subject to be measured;

(c) means for applying a second field to said subject so as to generate NMR signals from said portion to be measured;

(d) means for applying a third field to said subject so as to change coherence of said nuclear spin in accordance with a temperature distribution of said portion to be measured;

(e) means for reading said NMR signals, and acquiring the temperature state of said portion to be measured from the change of intensity of said NMR signals corresponding to the change of coherence of said nuclear spin;

(f) means for executing the operations of said means (b) through (f) for a second portion of said subject whose temperature is known and serves as a reference portion, and acquiring a relation between the intensity change of said NMR signal and the temperature; and (g) means for comparing the intensity change of said NMR signal obtained from said portion to be measured with said relation, and expressing the temperature of said portion to be measured in an absolute unit.

18. An apparatus according to claim 17, wherein said means for applying a second field applies a radio frequency field.

19. An apparatus for measuring a perfusion rate of a body fluid of a subject, comprising:

means for obtaining in advance a relation between a temperature state of a portion of a subject to be measured, for which the perfusion rate of the body fluid must be measured, and the perfusion rate of said body fluid;

means for applying a static field to said subject;

means for applying a first field to said subject so as to excite a nuclear spin at said portion of said subject to be measured;

means for applying a second field to said subject so as to generate NMR signals from said portion to be measured;

means for applying a third field to said subject so as to change coherence of said nuclear spin in accordance with a temperature distribution of said portion to be measured;

means for reading said NMR signals and obtaining the temperature state of said portion to be measured from the change of intensity of said NMR signals corresponding to the change of coherence of said nuclear spin; and means for acquiring the perfusion rate of the body fluid of said portion to be measured by comparing said temperature state with said relation.

20. An apparatus according to claim 19, wherein the body fluid is blood and said means for applying the second field applies a radio frequency field.

* * * * *